United States Patent
Park et al.

(10) Patent No.: US 10,297,575 B2
(45) Date of Patent: May 21, 2019

(54) SEMICONDUCTOR DEVICE UTILIZING AN ADHESIVE TO ATTACH AN UPPER PACKAGE TO A LOWER DIE

(71) Applicant: Amkor Technology, Inc., Tempe, AZ (US)

(72) Inventors: Joon Young Park, Seoul (KR); Jung Soo Park, Seongnam-si (KR); Ji Hye Yoon, Gwangmyeong-si (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/148,747

(22) Filed: May 6, 2016

(65) Prior Publication Data

US 2017/0323868 A1 Nov. 9, 2017

(51) Int. Cl.
*H01L 25/065* (2006.01)
*H01L 23/31* (2006.01)
*H01L 25/10* (2006.01)

(52) U.S. Cl.
CPC ...... *H01L 25/0657* (2013.01); *H01L 23/3142* (2013.01); *H01L 23/3185* (2013.01); *H01L 25/105* (2013.01); *H01L 2224/16225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2225/06513* (2013.01); *H01L 2225/06517* (2013.01); *H01L 2225/06544* (2013.01); *H01L 2225/06555* (2013.01); *H01L 2924/15311* (2013.01)

(58) Field of Classification Search
CPC ............. H01L 25/0657; H01L 23/3185; H01L 2225/06555; H01L 2224/32145; H01L 2225/1058
See application file for complete search history.

(56) References Cited

U.S. PATENT DOCUMENTS

| | | | | |
|---|---|---|---|---|
| 8,008,121 B2 * | 8/2011 | Choi | ................. | H01L 24/29 257/127 |
| 8,314,492 B2 * | 11/2012 | Egawa | ................. | H01L 21/568 257/686 |
| 2006/0208349 A1 * | 9/2006 | Fukuda | ................. | H01L 24/13 257/686 |
| 2007/0090508 A1 * | 4/2007 | Lin | ................. | H01L 25/0657 257/686 |
| 2008/0211083 A1 * | 9/2008 | Kang | ................. | H01L 24/19 257/700 |
| 2011/0227209 A1 * | 9/2011 | Yoon | ................. | H01L 23/3128 257/686 |
| 2014/0103527 A1 * | 4/2014 | Marimuthu | ......... | H01L 23/3121 257/737 |

(Continued)

*Primary Examiner* — Khiem D Nguyen
(74) *Attorney, Agent, or Firm* — McAndrews, Held & Malloy, Ltd.

(57) ABSTRACT

An electronic device and a method of making an electronic device. As non-limiting examples, various aspects of this disclosure provide various methods of manufacturing electronic devices, and electronic devices manufactured thereby, that comprise utilizing an adhesive layer to attach an upper electronic package to a lower die and/or utilizing metal pillars for electrically connecting the upper electronic package to a lower substrate, wherein the metal pillars have a smaller height above the lower substrate than the lower die.

16 Claims, 5 Drawing Sheets

(56) References Cited

U.S. PATENT DOCUMENTS

| | | | |
|---|---|---|---|
| 2015/0041972 A1* | 2/2015 | Shih | H01L 24/97 257/737 |
| 2015/0091149 A1* | 4/2015 | Jang | H01L 23/3128 257/686 |
| 2016/0027764 A1* | 1/2016 | Kim | H01L 24/97 257/686 |
| 2016/0064309 A1* | 3/2016 | Su | H01L 21/565 257/773 |
| 2016/0148904 A1* | 5/2016 | Zhai | H01L 21/4853 257/777 |

* cited by examiner

SEMICONDUCTOR DEVICE UTILIZING AN ADHESIVE TO ATTACH AN UPPER PACKAGE TO A LOWER DIE

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

SUMMARY

Various aspects of this disclosure provide an electronic device and a method of making an electronic device. As non-limiting examples, various aspects of this disclosure provide various methods of manufacturing electronic devices, and electronic devices manufactured thereby, that comprise utilizing an adhesive layer to attach an upper electronic package to a lower die and/or utilizing metal pillars for electrically connecting the upper electronic package to a lower substrate, wherein the metal pillars have a smaller height above the lower substrate than the lower die.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In the drawings, the thickness or size of layers, regions, and/or components may be exaggerated for clarity. Accordingly, the scope of this disclosure should not be limited by such thickness or size. Additionally, in the drawings, like reference numerals may refer to like elements throughout the discussion.

It will also be understood that when an element A is referred to as being "connected to" or "coupled to" an element B, the element A can be directly connected to the element B or indirectly connected to the element B (e.g., an intervening element C (and/or other elements) may be present between the element A and the element B).

Various aspects of the present disclosure provide an electronic device (e.g., a semiconductor device) that has a reduced thickness, and a manufacturing method thereof characterized by a reduced processing time and a reduced processing cost.

Various aspects of the present invention provide a semiconductor device that includes a semiconductor die on a substrate, an interconnection structure electrically connecting the substrate and the semiconductor die, an adhesive layer (or adhesion member) on (or adhered to) the semiconductor die, an upper semiconductor package adhered to the adhesive layer, and an encapsulant on the substrate and encapsulating the upper semiconductor package.

The semiconductor device may further include a pillar on and protruding from the substrate, wherein the pillar is electrically connected to the upper semiconductor package. The pillar may have a smaller height than the semiconductor die relative to a top side (or surface) of the substrate. The semiconductor device may further include a conductive bump between the pillar and the upper semiconductor package. The upper semiconductor package may include a package substrate, a packaged semiconductor die, and a package encapsulant. The package encapsulant may encapsulate the semiconductor die of the upper semiconductor package. The encapsulant may encapsulate the side and bottom portions of the upper semiconductor package. The adhesive layer may be on the entire top portion of the semiconductor die. The upper semiconductor package may have a larger area than the semiconductor die. The semiconductor device may further include an underfill between the substrate and the semiconductor die.

Various aspects of the present disclosure provide a semiconductor device including a substrate, a semiconductor die on the substrate, an interconnection structure (or conductive connection member) electrically connecting the substrate and the semiconductor die, a pillar on and protruding from the substrate and having a smaller height than the semiconductor die, an upper semiconductor package mounted on the semiconductor die and electrically connected to the pillar, and an encapsulant on the substrate and encapsulating the upper semiconductor package.

The semiconductor device may further include an adhesive layer (or adhesion member) between the semiconductor die and the upper semiconductor package. The semiconductor device may further include a conductive bump between the pillar and the upper semiconductor package. The encapsulant may encapsulate side and bottom portions of the upper semiconductor package.

Various aspects of the present disclosure provide a method of manufacturing a semiconductor device, the method including coupling a semiconductor die to a top side (or portion) of a substrate, forming an adhesive layer (or adhesion member) on the semiconductor die, coupling an upper semiconductor package on a top side (or portion) of the adhesive layer, and forming an encapsulant on the substrate to encapsulate the upper semiconductor package.

The encapsulant may be formed to encapsulate side and bottom portions of the upper semiconductor package. The adhesive layer (or adhesion member) may be formed on the entire top side (or portion) of the semiconductor die. The substrate may have a pillar formed thereon and the upper semiconductor package may be electrically connected to the pillar. The pillar may be formed to have a smaller height than the semiconductor die above the substrate. The fabricating method may further include forming a conductive bump between the pillar and the upper semiconductor package.

Various aspects of the present disclosure provide an electronic device including: a substrate that includes a top substrate side, a bottom substrate side, and lateral substrate sides between the top and bottom substrate sides; a semiconductor die that includes a top die side, a bottom die side, and lateral die sides between the top and bottom die sides, where the bottom die side is coupled to the top substrate side; a first conductive interconnection structure between the semiconductor die and the substrate and electrically connecting the semiconductor die to the substrate; an adhesive layer that includes a top adhesive layer side, a bottom adhesive layer side, and lateral adhesive layer sides between the top and bottom adhesive layer sides, where the bottom adhesive layer side is adhered to the top die side; an upper semiconductor package that includes a top upper package side, a bottom upper package side, and lateral upper package sides between the top and bottom upper package sides, where the bottom upper package side is adhered to the top adhesive layer side; and a first encapsulating material that covers at least the top substrate side and the lateral upper package sides.

The adhesive layer may, for example, cover the entire top die side. The first encapsulating material may, for example, cover the lateral adhesive layer sides. The first encapsulating material may, for example, include a surface that is coplanar with the top adhesive layer side. The upper semiconductor package may, for example, include an upper package substrate, and the first encapsulating material may cover a bottom side of the upper package substrate. The first encapsulating material may, for example, cover any one or more of: the lateral sides of the upper package substrate, the lateral die sides, the lateral adhesive layer sides, etc. The upper semiconductor package may include an upper package encapsulating material that includes lateral side surfaces that may be covered by the first encapsulating material and/or a top surface that is coplanar with a top side (or surface) of the first encapsulating material. The electronic device may include a metal pillar on the top substrate side and a conductive bump on the metal pillar, where the metal pillar and the conductive bump connect the upper semiconductor package to the substrate, and where the first encapsulating material covers the metal pillar and the conductive bump. The top end of the metal pillar may, for example, be lower than the top die side and/or higher than the bottom die side relative to the top substrate side.

Various aspects of the present disclosure provide an electronic device including: a substrate that includes a top substrate side, a bottom substrate side, and lateral substrate sides between the top and bottom substrate sides; a semiconductor die that includes a top die side, a bottom die side, and lateral die sides between the top and bottom die sides, wherein the bottom die side is coupled to the top substrate side; a first conductive interconnection structure between the semiconductor die and the substrate and electrically connecting the semiconductor die to the substrate; an adhesive layer that includes a top adhesive layer side, a bottom adhesive layer side, and lateral adhesive layer sides between the top and bottom adhesive layer sides, where the bottom adhesive layer side is adhered to the top die side; an upper semiconductor package that includes a top upper package side, a bottom upper package side, and lateral upper package sides between the top and bottom upper package sides, wherein the bottom upper package side is adhered to the top adhesive layer side; and a conductive pillar on the top substrate side and that is electrically connected to the upper semiconductor package, where the conductive pillar includes a top pillar end that is lower than the top die side.

The top pillar end may, for example, be higher than the bottom die side. The encapsulating material may, for example, cover the top substrate side, the lateral die sides, and the lateral adhesive layer sides. The encapsulating material may, for example, cover the lateral upper package sides and may include a top side (or surface) that is coplanar with the top upper package side.

Various aspects of this disclosure may provide an electronic device including: a substrate that includes a top substrate side, a bottom substrate side, and lateral substrate sides between the top and bottom substrate sides; a semiconductor die that includes a top die side, a bottom die side, and lateral die sides between the top and bottom die sides, where the bottom die side is coupled to the top substrate side; a first conductive interconnection structure between the semiconductor die and the substrate and electrically connecting the semiconductor die to the substrate; an adhesive layer that includes a top adhesive layer side, a bottom adhesive layer side, and lateral adhesive layer sides between the top and bottom adhesive layer sides, where the bottom adhesive layer side is adhered to the top die side; an upper semiconductor package that includes a top upper package side, a bottom upper package side, and lateral upper package sides between the top and bottom upper package sides, wherein the bottom upper package side is adhered to the top adhesive layer side; and a first encapsulating material that covers at least the top substrate side, the lateral die sides, and the lateral adhesive layer sides.

The electronic device may, for example, include an upper package encapsulating material that includes lateral sides (or surfaces) that are covered by the first encapsulating material, and a top side (or surface) that is coplanar with a top side (or surface) of the first encapsulating material. The adhesive layer may, for example, cover the entire top die side. The first encapsulating material may, for example, include a surface that is coplanar with the top adhesive layer side (or surface). The electronic device may, for example, include a conductive pillar on the top substrate side and that is electrically connected to the upper semiconductor package, where the conductive pillar includes a top pillar end that is lower than the top die side.

The above and other aspects of the present disclosure will be described in or be apparent from the following description of various example implementations. Various aspects of the present disclosure will now be presented with reference to accompanying drawings.

Figure 1:
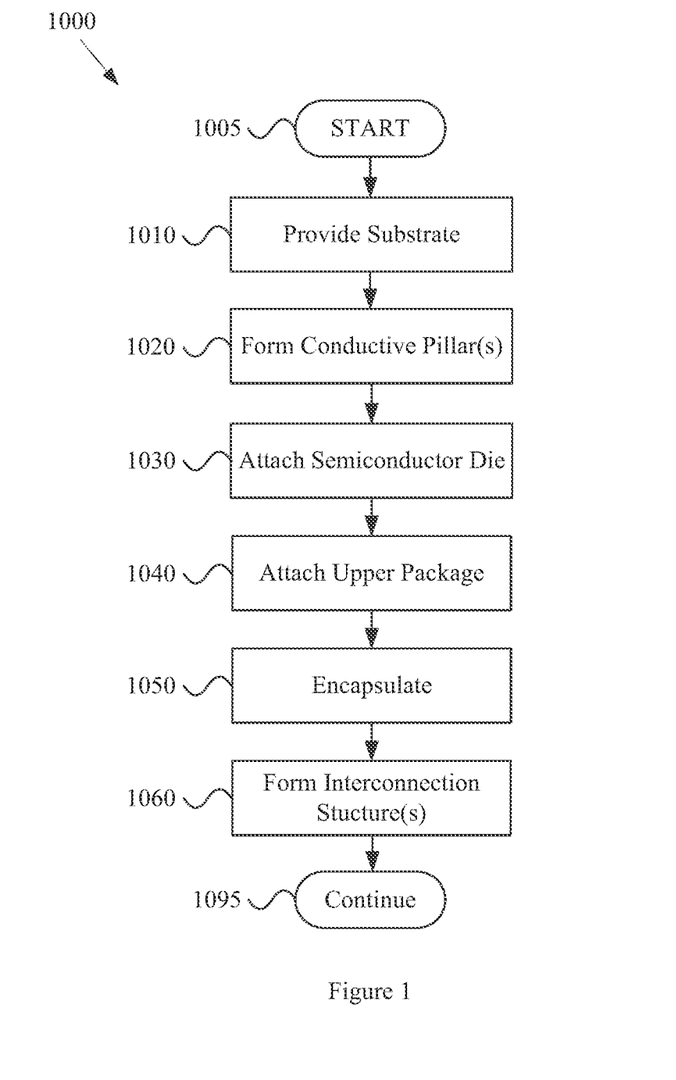
FIG. 1 shows a flow diagram of an example method of making an electronic device, in accordance with various aspects of the present disclosure.

FIG. 1 shows a flow diagram of an example method 1000 of making an electronic device, in accordance with various aspects of the present disclosure. The example method 1000 may, for example, share any or all characteristics with any other method discussed herein. FIGS. 2A-2E show cross-sectional views illustrating example electronic devices and example methods of making an electronic device, in accordance with various aspects of the present disclosure. The structures shown in 2A-2E may share any or all characteristics with analogous structures shown in FIG. 3, etc. FIGS. 2A-2E may, for example, illustrate an example electronic device at various stages (or blocks) of the example method 1000 of FIG. 1. FIGS. 1 and 2A-2E will now be discussed together. It should be noted that the order of the example blocks (or portions thereof) of the example method 1000 may vary without departing from the scope of this disclosure. It should also be noted that any of the blocks (or portions thereof) may be omitted and/or additional blocks (or portions thereof) may be added without departing from the scope of this disclosure.

The example method 1000 may, at block 1010, comprise providing a substrate. Block 1010 may comprise providing the substrate in any of a variety of manners, non-limiting examples of which are provided herein.

The substrate may comprise any of a variety of characteristics, non-limiting examples of which are provided herein. For example, the substrate may comprise a circuit board material (e.g., FR-4 glass epoxy, G-10 woven glass and epoxy, FR-n with n=1 to 6, CEM-m with m=1 to 4, laminate, laminate thermoset resin, copper-clad laminate, resin impregnated B-state cloth (pre-preg), polytetrafluoroethylene, combinations thereof, equivalents thereof, etc.). The substrate may also, for example, be coreless. The substrate may comprise one or more layers of any of a variety of dielectric materials, for example inorganic dielectric material (e.g., $Si_3N_4$, $SiO_2$, SiON, SiN, oxides, nitrides, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, etc.), but the scope of the present disclosure is not limited thereto. The substrate may, for example, comprise silicon or any of a variety of semiconductor materials. The substrate may also, for example, comprise a glass or metal plate (or wafer). The substrate may have any of a variety of configurations. For example, the substrate may be in wafer or panel form. The substrate may also, for example, be in diced or singulated form.

The substrate may, for example, be or comprise a bulk material with no conductive routing paths. Alternatively for example, the substrate may comprise one or more conductive layers, vias, and or signal distribution structures. For example, the substrate may comprise conductive vias extending into the substrate from the top surface thereof to or toward the bottom surface thereof. For example, the substrate may comprise a single or multi-layer signal distribution structure.

Block 1010 may, for example, comprise providing the substrate by, at least in part, receiving the substrate, any portion or all of which is already formed. For example, block 1010 may comprise receiving the substrate from another geographical location via shipping, receiving the substrate from an upstream (or other) manufacturing process, test process, etc.

Block 1010 may also, for example, comprise providing the substrate by, at least in part, forming the substrate or any portion thereof. Examples of such forming are provided herein.

In an example implementation, block 1010 may comprise providing a carrier. The carrier may comprise any of a variety of different materials and/or physical characteristics. For example, the carrier may comprise silicon, glass, metal, plastic, etc. The carrier may, for example, be wafer-shaped, panel-shaped, etc.

Block 1010 may comprise forming a first conductive layer on the carrier. The first conductive layer may comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto.

Block 1010 may comprise forming (or depositing) the first conductive layer utilizing any one or more of a variety of processes (e.g., electrolytic plating, electroless plating, chemical vapor deposition (CVD), sputtering or physical vapor deposition (PVD), atomic layer deposition (ALD) plasma vapor deposition, printing, screen printing, lithography, etc.), but the scope of the present disclosure is not limited thereto.

Block 1010 may comprise configuring the first conductive layer as lands (or pads, or traces, etc.), for example for later connection to interconnection structures as formed at block 1060. Block 1010 may, for example, comprise configuring the first conductive layer in any of a variety of manners, for example while forming the first conductive layer (e.g., by masking, selective printing, etc.) and/or after forming the first conductive layer (e.g., by etching, ablating, etc.).

Note that, depending on the manner in which the first conductive layer is formed, a seed layer may first be deposited. Such a seed layer may, for example, be utilized during an electroplating process, to increase a bond strength during other metal deposition processes, etc.

In an example implementation in which the first conductive layer is patterned (or configured) as one or more substrate interconnect lands (or pads, traces, patterns, etc.), the first conductive layer may be formed with under bump metallization, for example to enhance the later attachment of interconnection structures (e.g., at block 1060).

In an example implementation, the under bump metallization ("UBM") structure, which may also be referred to as an under bump metal structure, may for example comprise a layer of titanium-tungsten (TiW), which may be referred to as a layer or seed layer. Such layer may, for example, be formed by sputtering. Also for example, the UBM structure may comprise a layer of copper (Cu) on the layer of TiW. Such layer may also, for example, be formed by sputtering. In another example implementation, forming a UBM structure may comprise forming a layer of titanium (Ti) or titanium-tungsten (TiW) by sputtering, (ii) forming a layer of copper (Cu) on the titanium or titanium-tungsten layer by sputtering, and (iii) forming a layer of nickel (Ni) on the copper layer by electroplating. Note, however, that the UBM structure and/or processes utilized to form the UBM structure are not limited to the examples given. For example, the UBM structure may comprise a multilayered structure of chrome/chrome-copper alloy/copper (Cr/Cr-Cu/Cu), titanium-tungsten alloy/copper (Ti—W/Cu), aluminum/nickel/copper (Al/Ni/Cu), equivalents thereof, etc. The UBM structure may also, for example, comprise aluminum, palladium, gold, silver, alloys thereof, etc.

Block 1010 may, for example, comprise forming a first dielectric layer on the first conductive layer and on the carrier. The first dielectric layer may comprise one or more layers of any of a variety of dielectric materials, for example inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto.

Block 1010 may comprise forming the first dielectric layer utilizing any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto.

The first dielectric layer may comprise openings (or apertures or vias) that expose the first conductive layer (or portions thereof) through the first dielectric layer. Such openings may be formed during deposition of the first dielectric layer (e.g., by masking, selective printing, etc.). Also such openings may be formed after the deposition of the first dielectric layer (e.g., by mechanical ablation, laser ablation, chemical etching or dissolving, etc.).

The processes of forming the first conductive layer and/or the first dielectric layer may be repeated any number of times. For example, block 1010 may comprise forming a multiple layered signal distribution structure comprising any number of conductive and dielectric layers.

In an example implementation, block 1010 may comprise configuring a final conductive layer as interconnect pads for one or more electronic components to be attached thereto (e.g., at block 1030) and/or for one or more conductive pillars to be attached thereto (or formed thereon) (e.g., at block 1020). In such an example implementation, as with the interconnect lands discussed herein, block 1010 may comprise forming the interconnect pads (or lands, traces, patterns, etc.) with the same conductive material utilized for the rest of the traces of the signal distribution structure, but may also comprise forming an under bump metallization as discussed herein.

Figure 2A:
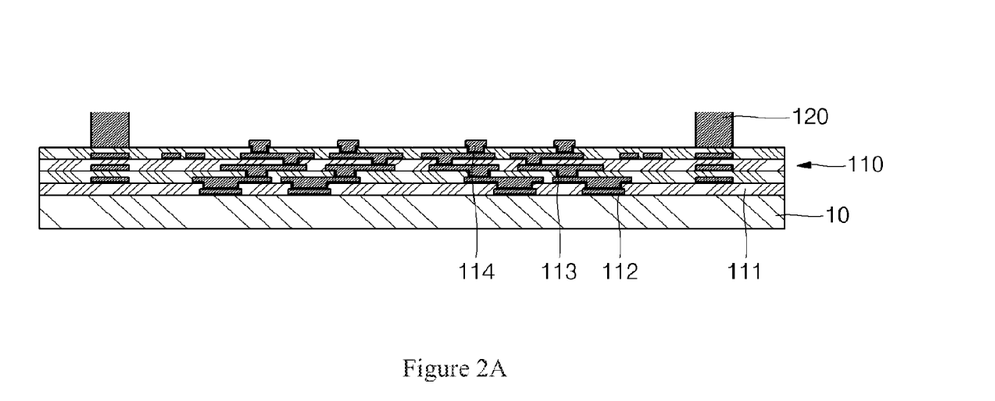
FIGS. 2A-2E show cross-sectional views illustrating example electronic devices and example methods of making an electronic device, in accordance with various aspects of the present disclosure.

FIG. 2A provides an example illustration of various aspects of block 1010. The example implementation 200A (or assembly, sub-assembly, package, etc.) comprises a substrate 110 on a carrier 10. The example substrate 110 comprises substrate interconnect lands 112, conductive layers (e.g., traces, conductive vias, etc.) 113 for signal distribution, and substrate interconnect pads 114. The example substrate 110 also comprises multiple dielectric layers 111 between and around the various conductive layers.

In general, block 1010 comprises providing a substrate. Accordingly, the scope of this disclosure should not be limited by characteristics of any particular type of substrate or by any particular manner of providing a substrate.

The example method 1000 may, at block 1020, comprise forming one or more conductive pillars. Block 1020 may comprise forming the conductive pillars (or posts) in any of a variety of manners, non-limiting examples of which are provided herein.

Block 1020 may, for example, comprise forming a conductive pillar on a substrate interconnection pad (e.g., as formed at block 1010) or other conductive layer portion. As discussed herein, the substrate interconnection pad may, for example, comprise any of a variety of conductive materials (e.g., copper, aluminum, silver, gold, nickel, alloys thereof, etc.). The substrate interconnection pad may, for example, be exposed through an aperture in a dielectric layer (e.g., a top dielectric layer) of the substrate. The dielectric layer may, for example, cover side surfaces of the substrate interconnection pad and/or an outer perimeter of the top surface of the interconnection pad.

In an example implementation, block 1020 (or block 1010) may, for example, comprise forming a UBM seed layer over the dielectric layer and/or over the portion of the pad that is exposed through the aperture in the dielectric layer. As discussed herein, the UBM seed layer may, for example, comprise any of a variety of conductive materials (e.g., copper, gold, silver, metal, etc.). The UBM seed layer may be formed in any of a variety of manners (e.g., sputtering, electroless plating, CVD, PVD, ALD, etc.).

Block 1020 may, for example, comprise forming a mask (or template) over the UBM seed layer to define a region (or volume) in which a UBM and/or the conductive pillar (or other interconnection structure) is to be formed. For example, the mask may comprise a photoresist (PR) material or other material, which may be patterned to cover regions other than the region on which a UBM and/or conductive pillar is to be formed. Block 1020 may then, for example, comprise forming a UBM layer on the UBM seed layer exposed through the mask. As discussed herein, the UBM may comprise any of a variety of materials (e.g., titanium, chromium, aluminum, titanium/tungsten, titanium/nickel, copper, alloys thereof, etc.). Block 1020 may comprise forming the UBM on the UBM seed layer in any of a variety of manners (e.g., electroplating, electroless plating, sputtering, CVD, PVD, ALD, etc.).

Continuing the example implementation, block 1020 may then, for example, comprise forming the conductive pillar on the UBM. The conductive pillar (or post) may comprise any of a variety of characteristics. For example, the conductive pillar may be cylinder-shaped, elliptical cylinder-shaped, rectangular post-shaped, etc.). The conductive pillar may comprise a flat upper end, a concave upper end, a convex upper end, a combination thereof, etc. The conductive pillar may, for example, comprise any of the materials discussed herein with regard to the conductive layers. In an example implementation, the conductive pillar may comprise copper (e.g., pure copper, copper with some impurities, etc.), a copper alloy, etc.). In an example implementation, block 1020 (or another block of the example method 1000) may also comprise forming a solder cap (or dome) or a tinning layer on the conductive pillar.

After forming the conductive pillar(s), block 1020 may comprise stripping or removing the mask (e.g., chemical stripping, ashing, etc.). Additionally, block 1020 may comprise removing at least a portion of the UBM seed layer (e.g., at least a portion of the UBM seed layer that is not covered by the conductive pillar (e.g., by chemically etching, etc.). Note that during the etching of the seed layer, a lateral edge portion of at least the UBM seed layer may, for example, be etched. Such etching may, for example, result in an undercut beneath the conductive pillar and/or UBM.

As discussed herein, in an example configuration, block 1020 may comprise forming the conductive pillar(s) to have a height above the substrate that is less than a height of one or more electronic components (e.g., to be attached at block 1030). For example, block 1020 may comprise forming the conductive pillar(s) to have a height above the substrate that is vertically between a bottom side and a top side of one or more semiconductor die attached at block 1030. In an example scenario, block 1020 may comprise forming the conductive pillar(s) to have a height of 100 μm+/−10 μm. In another example scenario, block 1020 may comprise forming the conductive pillar(s) to have a height 90% or less than the height of a top side of a semiconductor die (or other component) attached at block 1030. In another example scenario, block 1020 may comprise forming the conductive pillars(s) to have a height that is between the height of a top side of a semiconductor die (or other component) attached at block 1030 and the height of a bottom side of the semiconductor die (or other component).

Block 1020 may comprise arranging (or positioning) a plurality of conductive pillars around a perimeter of an area of the substrate to which one or more electronic components are to be attached at block 1030. For example, block 1020 may comprise forming conductive pillars around two sides of such an area, around four sides of such an area, etc. In an example implementation in which a semiconductor die is to be mounted at block 1030 to a die-mounting area of the substrate, block 1020 may comprise forming conductive pillars surrounding the die-mounting area.

In an example implementation, various portions of blocks 1010 and 1020 may be combined. For example, at least a portion of a conductive pillar formed at block 1020 may be formed at block 1010, for example during pad formation and/or the formation of other interconnection structures at the top side of the substrate.

Although the examples presented herein generally concern the forming of conductive pillars, any of a variety of interconnection structures may be formed. Similarly, although the examples presented herein generally concerned plating the conductive pillars, any of a variety of forming processes may be utilized. For example, block 1020 may comprise forming a conductive pillar by plating the conductive pillar, bonding a wire (e.g., a wire-bonding wire) to the substrate and cutting (or breaking) the wire at the desired height above the substrate, etc. Additionally, block 1020 may comprise forming the conductive pillar utilizing any of the conductive layer forming techniques disclosed herein.

An example implementation 200A showing various aspects of block 1020 is shown at FIG. 2A. The example implementation 200A (or assembly, sub-assembly, package, etc.) comprises conductive pillars 120 on the top side of the substrate 110.

In general, block 1020 comprises forming one or more conductive pillars. Accordingly, the scope of this disclosure should not be limited by characteristics of any particular type of conductive pillar (or other interconnection structure) or by any particular manner of forming a conductive pillar (or other interconnection structure).

The example method 1000 may, at block 1030, comprise attaching a semiconductor die. Block 1030 may comprise attaching (or mounting) one or more semiconductor die (and/or other electronic component(s)) in any of a variety of manners, non-limiting examples of which are provided herein.

Though the examples presented herein generally concern the attaching of one or more semiconductor die, any one or more of a variety of electronic components (e.g., instead of or in addition to the semiconductor die) may be attached. The one or more electronic component(s) may, for example, comprise a semiconductor die. Such semiconductor die may, for example, comprise a processor die, microprocessor, microcontroller, co-processor, general purpose processor, application-specific integrated circuit, programmable and/or discrete logic device, memory device, combination thereof, equivalent thereof, etc. The one or more electronic components may also, for example, comprise one or more passive electronic devices (e.g., resistors, capacitors, inductors, etc.).

Block 1030 may comprise attaching (or mounting) the semiconductor die to the substrate utilizing any of a variety of types of interconnection structures (e.g., conductive balls or bumps, solder balls or bumps, metal posts or pillars, copper posts or pillars, solder-capped posts or pillars, solder paste, conductive adhesive, etc.). Block 1030 may comprise mounting the electronic component(s) to the substrate utilizing any of a variety of bonding techniques (e.g., thermocompression bonding, mass reflow, adhesive attachment, etc.). In an example implementation, block 1030 may comprise utilizing conductive bumps to electrically connect die bond pads of the semiconductor die to respective substrate bond pads of the substrate. Such die bond pads may, for example, be exposed through respective openings (or apertures) in a dielectric layer (or passivation layer) on the semiconductor die.

Block 1030 may also, for example, comprise forming an underfill between the mounted semiconductor die and the substrate. The underfill may comprise any of a variety of types of material, for example, an epoxy, a thermoplastic material, a thermally curable material, polyimide, polyurethane, a polymeric material, filled epoxy, a filled thermoplastic material, a filled thermally curable material, filled polyimide, filled polyurethane, a filled polymeric material, a fluxing underfill, and equivalents thereof, but not limited thereto. The underfill may be formed in any of a variety of manners (e.g., capillary underfilling, pre-applied underfilling of a liquid or paste or preformed sheet, molded underfilling, etc.). Such underfill may comprise any of a variety of characteristics (e.g., capillary underfill, pre-applied underfill, molded underfill, etc.). Note that in various alternative example implementations, such underfill is not formed at block 1030 (e.g., never formed, formed at a later process step, etc.).

Figure 2B:
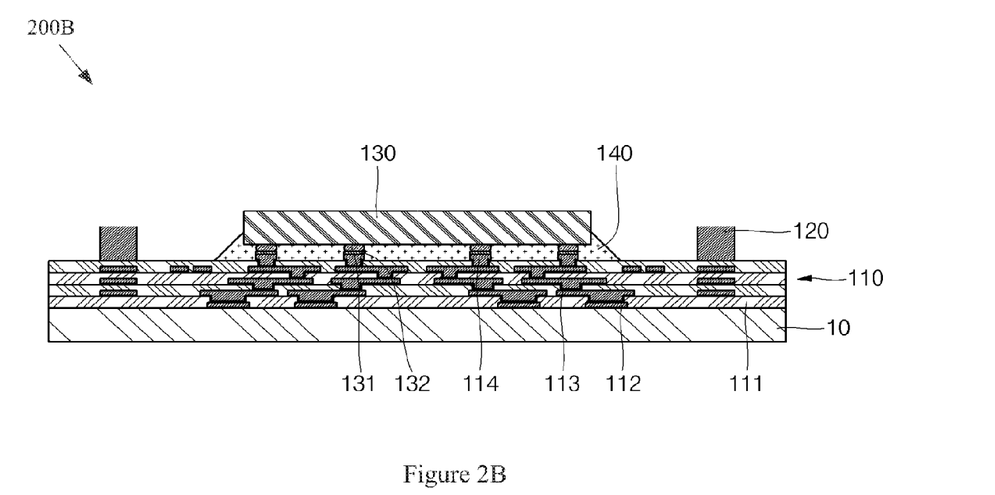

An example implementation 200B showing various aspects of block 1030 is shown at FIG. 2B. The example implementation 200B (or assembly, sub-assembly, package, etc.) comprises a substrate 110, substrate interconnect pads 114, a semiconductor die 130, die interconnect pads 131, interconnection structures 132, and an underfill 140.

The example semiconductor die 130 is mounted on the top side of the substrate 110. For example, each of the die interconnect pads 131 (or land, trace, pattern, etc.) of the semiconductor die 130 is connected to a respective substrate interconnect pad 114 (or land, trace, pattern, etc.) of the substrate 110 with a respective interconnection structure 132 (e.g., a conductive bump or ball, solder bump or ball, conductive post or pillar, copper post or pillar, etc.). The interconnection structure 132, for example, electrically and mechanically connects the semiconductor die 130 to the substrate 110. Note that in an alternative implementation, the back side of the die 130 may be bonded to the substrate 110, and front side pads thereof may be connected to the substrate interconnect pads 114 with bond wires.

The underfill 140 fills a volume between the semiconductor die 130 and a region of the substrate 110 adjacent to and covered by the semiconductor die 130. The underfill 140 enhances physical/mechanical coupling forces between the substrate 110 and the semiconductor die 130 and prevents or inhibits the substrate 110 and the semiconductor die 130 from being separated from each other, for example due to stress applied by a difference in thermal expansion coefficient between the substrate 110 and the semiconductor die 130 (e.g., for example during production, during end use in a consumer electronics product, etc.).

The height of the top side of the example semiconductor die 130 above the top side of the substrate 110 is greater than the height of the top side of the example conductive pillar 120. The height of the top side of the example conductive pillar 120 above the top side of the substrate 110 is greater than the height of the bottom side of the example semiconductor die 130.

In general, block 1030 may comprise attaching (or mounting) one or more semiconductor die (and/or other electronic component(s)) to the substrate. Thus, the scope of this disclosure should not be limited by characteristics of any particular electronic component or of any particular manner of attaching (or mounting) an electronic component.

The example method 1000 may, at block 1040, comprise attaching an upper package. Block 1040 may comprise attaching (or stacking) the upper package in any of a variety of manners, non-limiting examples of which are provided herein.

The upper package may, for example, comprise a preformed package (e.g., a semiconductor package, etc.). Such a preformed package may, for example, comprise an upper package substrate (and/or signal distribution structure), an upper package semiconductor die mounted to the upper package substrate, and an upper package encapsulant (or encapsulating material). The upper package substrate may, for example, comprise characteristics of any substrate discussed herein. The upper package encapsulant may, for example, encapsulate a top side of the upper package substrate, and lateral and top sides of the upper package semiconductor die. The upper package encapsulant may also, for example, encapsulate interconnection structures (e.g., wires, bumps, balls, pillars, etc.) that couple the upper package die to the upper package substrate. The upper package encapsulant may also, for example, cover lateral sides of the upper package substrate. In an example implementation, the upper package may comprise an adhesive layer between the upper package semiconductor die and the upper package substrate.

The upper package may, for example, have a larger footprint than the semiconductor die attached at block 1030. The upper package may, for example, have a footprint that is smaller than the substrate provided at block 1010. For example, the upper package may cover an area of the substrate large enough to cover the conductive pillars formed at block 1020 and the semiconductor die attached at block 1030.

Block 1040 may, for example, comprise forming an adhesive layer (or adhesion member) on the top side (or surface) of the semiconductor die, and attaching the upper package thereto. The adhesive layer may, for example, comprise a bottom side that is adhered to the top side of the semiconductor die, a top side that is adhered to a bottom side of the upper package substrate. The adhesive layer may, for example, cover the entire top side of the semiconductor die. For example, the adhesive layer may be formed to the exact shape of the top side of the semiconductor die or may be larger than the top side of the semiconductor die, for example overhanging the peripheral edge of the top side of the semiconductor die, while not extending to the outer periphery of the upper package (or substrate thereof).

The adhesive layer may, for example, be thinner than general underfill layers. For example, in an example implementation, the adhesive layer may be 30 μm thick +/−10%. The adhesive layer may, for example, be less than half as thick or less than one fourth as thick as an underfill layer between the semiconductor die and the substrate.

The adhesive layer may comprise any of a variety of characteristics. The adhesive layer may, for example, comprise an adhesive paste or liquid, a performed sheet or film, etc. The adhesive layer may, for example, comprise a thermally conductive material (e.g., to enhance heat transfer, etc.) and/or electrically conductive material (e.g., to provide a reference voltage, such as a ground signal, etc.). Also, for example, the adhesive layer may comprise a dielectric material. The adhesive layer may, for example, comprise a material that is different from a material generally associated with underfilling.

For example, in an example implementation, there might be no conductive pathways through the adhesive layer. In such an example implementation, the upper package might only be electrically connected to the substrate through the conductive pillars formed at block 1020.

The upper package may, for example, comprise interconnection structures (e.g., conductive bumps or balls, solder bumps or balls, conductive pillars or posts, copper pillars or posts, solder capped pillars or posts, etc.) on the bottom side of the upper package substrate (or signal distribution structure). Each of such interconnection structures may be aligned with and connected to a respective one of the conductive pillars formed at block 1020. When the upper package is attached, the bottom end of each of such interconnection structures may contact and be bonded to a respective top end of a respective one of the conductive pillars formed at block 1020, which as discussed herein may have a lower height than the top side of the semiconductor die. Thus, a bottom end of each of such interconnection structures may be below the level of the top side of the semiconductor die and/or above the level of the bottom side of the semiconductor die.

The interconnection structures on the upper package substrate may, for example, be coupled to the conductive pillars formed at block 1020 by reflowing the interconnection structures. Note that at this point in the example method 1000, there might be no encapsulating material around the conductive pillars and/or the interconnection structures to restrain the shape of the interconnection structures reflowing over the conductive pillars (e.g., such encapsulating being performed at block 1050). In various other example implementations, the interconnection structures may be coupled to the conductive pillars utilizing conductive adhesive, directed metal-to-metal bonding without reflow, etc.

Note that the interconnection structures may alternatively be formed on the conductive pillars before attachment to the upper package substrate. Also for example, the interconnection structures may be formed on both the conductive pillars and the upper package substrate prior to attachment of the upper package.

Figure 2C:
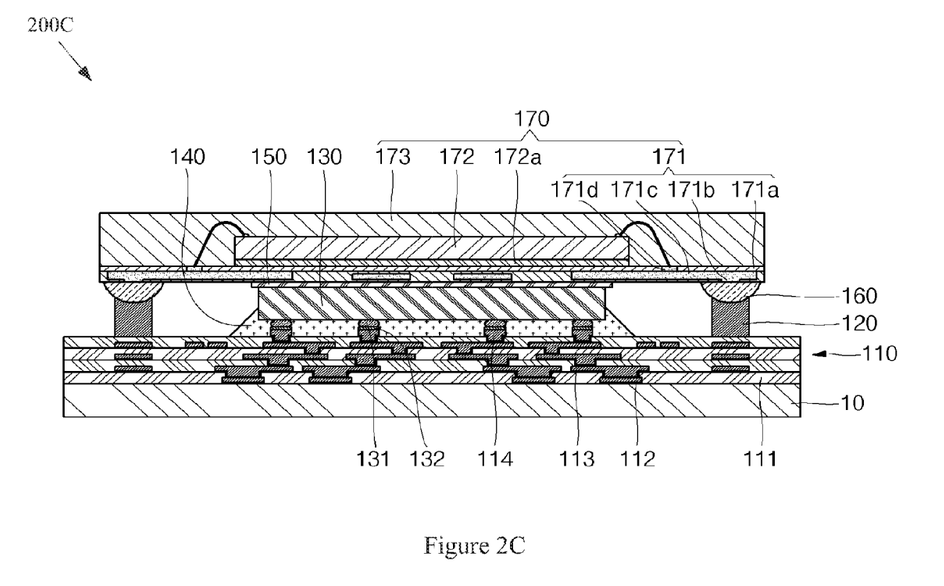

An example implementation 200C showing various aspects of block 1040 is shown at FIG. 2C. The example implementation 200C (or assembly, sub-assembly, package, etc.) comprises an upper semiconductor package 170. The example upper semiconductor package 170 comprises an upper package substrate 171, which in turn comprises a dielectric (or insulation) layer 171a, a land 171b (or plurality thereof) exposed through a respective aperture in the dielectric layer 171, a substrate bond pad 171d, and a conductive layer 171c electrically connecting the land 171b to the substrate bond pad 171d.

The example upper semiconductor package 170 also comprises an upper package die 172, a bottom side (e.g., a back side, inactive side, etc.) of which is coupled to a top side of the upper package substrate 171 with an upper package adhesive layer 172a. Die bond pads on the top side of the upper package die 172 may be electrically coupled to respective substrate bond pads 171d by respective wire bonds. Note that in an alternative configuration, the upper package die 172 may be coupled to the upper package substrate 171 using flip chip technology. In such an alternative configuration, the adhesive layer 172a may comprise an underfill material that surrounds conductive bumps that attach the upper package die 172 to the upper package substrate 171.

The example upper semiconductor package 170 also comprises an upper package encapsulant 173 (or encapsulating material) that covers the top side of the upper package substrate 171. In the example implementation 200C, the upper package encapsulant 173 has a top side, a bottom side that covers the upper package substrate 171, and lateral sides between the top and bottom sides. The lateral sides of the upper package encapsulant 173 may, for example, be coplanar with respective lateral sides of the upper package substrate 171. In an alternative implementation, the upper package encapsulant 173 may cover the lateral sides of the upper package substrate 171.

In general, block 1040 comprises attaching an upper package. Accordingly, the scope of this disclosure should not be limited by characteristics of any particular type of electronic package (e.g., a semiconductor package, etc.) or by any particular manner of attaching an electronic package (e.g., or semiconductor package, etc.).

The example method 1000 may, at block 1050, comprise encapsulating. Block 1050 may comprise performing the encapsulating in any of a variety of manners, non-limiting examples of which are provided herein.

The encapsulating material (or encapsulant) may, for example, cover any or all of the substrate provided at block 1010, the conductive pillar(s) formed at block 1020, the semiconductor die(s) attached at block 1030, the adhesive layer formed at block 1040, and/or the upper package attached at block 1040. For example, the encapsulating material may cover a top side of the substrate provided at block 1010, and may also but need not cover lateral sides of such substrate. Also for example, the encapsulating material may cover lateral surfaces of the conductive pillar(s) formed at block 1020. Additionally for example, the encapsulating material may cover all or a portion of the lateral sides of the semiconductor die(s) attached at block 1030. In an example scenario in which an underfill is between the semiconductor die and the substrate, the encapsulating material may cover lateral sides of such underfill. Alternatively, the encapsulating material may underfill between the semiconductor die and the substrate. Further for example, the encapsulating material may cover lateral sides of the adhesive layer formed at block 1040. In an example implementation in which the adhesive layer is larger than the semiconductor die, the encapsulating material may also cover a portion of the bottom surface of the adhesive layer (e.g., the portion not already covered by the top side of the semiconductor die).

The encapsulating material may also, for example, cover various portions of the upper package. For example, the encapsulating material may surround lateral surfaces of the interconnection structures attached to the conductive pillars. Also for example, the encapsulating material may cover a bottom side of the upper package substrate. Additionally for example, the encapsulating material may cover lateral sides of the upper package substrate and lateral sides of the upper package encapsulant. In an example implementation, the encapsulating material may leave the top side of the upper package (or encapsulant thereof) uncovered.

The encapsulating material may, for example, comprise a top surface that is coplanar with the top side (or surface) of the upper package (e.g., a top surface of the upper package encapsulant). The encapsulating material may also, for example, comprise lateral side surfaces that are coplanar with lateral sides of the substrate. The encapsulating material may additionally, for example, comprise a generally planar bottom surface that is on (e.g., directly on) the top surface of the substrate and parallel to such top surface.

The encapsulating material may also, for example, comprise planar interior surfaces that are on (e.g., directly on) the lateral sides of the upper package encapsulant and upper package substrate, and parallel to such lateral sides. The encapsulating material may additionally, for example, comprise a planar interior surface that is on (e.g., directly on) the bottom side of the upper package substrate, and which is coplanar with the top surface of the adhesive layer to which a portion of the bottom side of the upper package substrate is adhered.

The encapsulating material may comprise any comprise any of a variety of encapsulating or molding materials (e.g., resin, silicon resin, epoxy resin, polymer, polymer composite material (for example, epoxy resin with filler, epoxy acrylate with filler, or polymer with a filler, etc.) any of the dielectric materials presented herein), etc. The encapsulant may be formed in any of a variety of manners (e.g., compression molding, transfer molding, liquid encapsulant molding, vacuum lamination, paste printing, film assisted molding, etc.). Note that the encapsulant may comprise a same encapsulating material as the upper package encapsulant, or may comprise a different encapsulating material. The encapsulating material may, for example, comprise a single continuous and unitary material (e.g., formed in a single molding step).

In an example implementation, after the encapsulating is performed, the carrier (e.g., on which the substrate was provided (or formed) at block 1010) may be removed. Such removal may be performed in any of a variety of manners, for example depending on the nature of the carrier. For example, in an example implementation in which the carrier is silicon (e.g., a silicon wafer, etc.), the carrier may be removed utilizing a grinding process. Also for example, in an example implementation in which the carrier is a glass (or metal) plate, the carrier may be removed by breaking an adhesive bond between the carrier and the substrate (e.g., heating a thermally releasable adhesive, applying light or other energy to a light-releasable adhesive, applying chemicals to a chemically releasable adhesive, etc.).

Figure 2D:
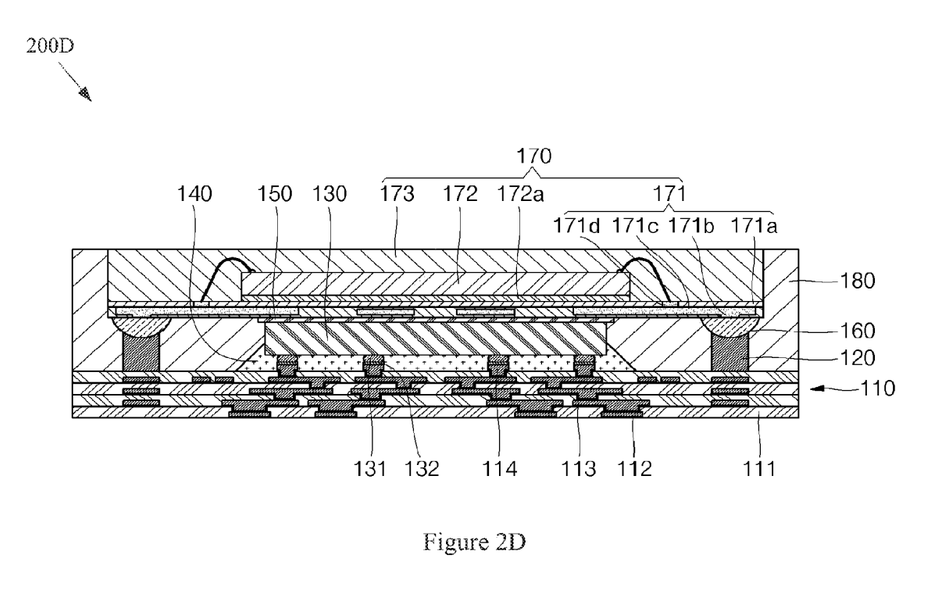

An example implementation 200D showing various aspects of block 1050 is shown at FIG. 2D. The example implementation 200D (or assembly, sub-assembly, package, etc.) comprises an encapsulating material 180.

The example encapsulating material 180 covers a top side of the substrate provided at block 110. Also for example, the example encapsulating material 180 covers lateral surfaces of the conductive pillars 120 and interconnection structures 160. Additionally, the example encapsulating material 180 covers at least a portion of the lateral sides of the semiconductor die 130 (e.g., those portions not covered by the underfill 140). The example encapsulating material 180 also covers lateral sides of the underfill 140. Note that in an alternative implementation, the encapsulating material 180 may underfill between the semiconductor die 130 and the substrate 110 (e.g., instead of the underfill 140). The example encapsulating material 180 also covers lateral sides of the adhesive layer 150. In the example implementation 200D, the adhesive layer 150 is shown extending beyond (or over-hanging) the top side of the die. The example encapsulating material 180 thus covers a peripheral portion of the bottom surface of the adhesive layer 150 (e.g., the portion not already covered by the top side of semiconductor die 130). Note, however, that the adhesive layer 150 may exactly match the top side of the semiconductor die 130, for example having lateral sides that are coplanar with lateral sides of the semiconductor die 130.

The example encapsulating material 180 also covers various portions of the upper semiconductor package 170. For example, the encapsulating material 180 surrounds lateral surfaces of the interconnection structures 160 attached to the conductive pillars 120. Also for example, the example encapsulating material 180 covers a bottom side of the upper package substrate 171. Additionally for example, the example encapsulating material 180 covers lateral sides of the upper package substrate 171 and the upper package encapsulant 173. In an example implementation, the example encapsulant 180 may leave the top side of the upper semiconductor package 170 (or encapsulant 173 thereof) uncovered.

The example encapsulating material 180 has a top side (or surface) that is coplanar with the top side (or surface) of the upper semiconductor package 170 (e.g., a top side of the upper package encapsulant). The example encapsulating material 180 also, for example, comprises lateral side surfaces that are coplanar with lateral sides of the substrate 110. The example encapsulating material 180 additionally comprises a generally planar bottom surface that is on (e.g., directly on) the top side (or surface) of the substrate 110 and parallel to such top side.

The example encapsulating material 180 also, for example, comprises planar interior surfaces that are on (e.g., directly on) the lateral sides of the upper package encapsulant 173 and upper package substrate 171, and parallel to such lateral sides. The example encapsulating material 180 additionally, for example, comprises a planar interior surface that is on (e.g., directly on) the bottom side of the upper package substrate 171, and which is coplanar with the top surface of the adhesive layer 150 to which a portion of the bottom side of the upper package substrate 171 is adhered.

Figure 2E:
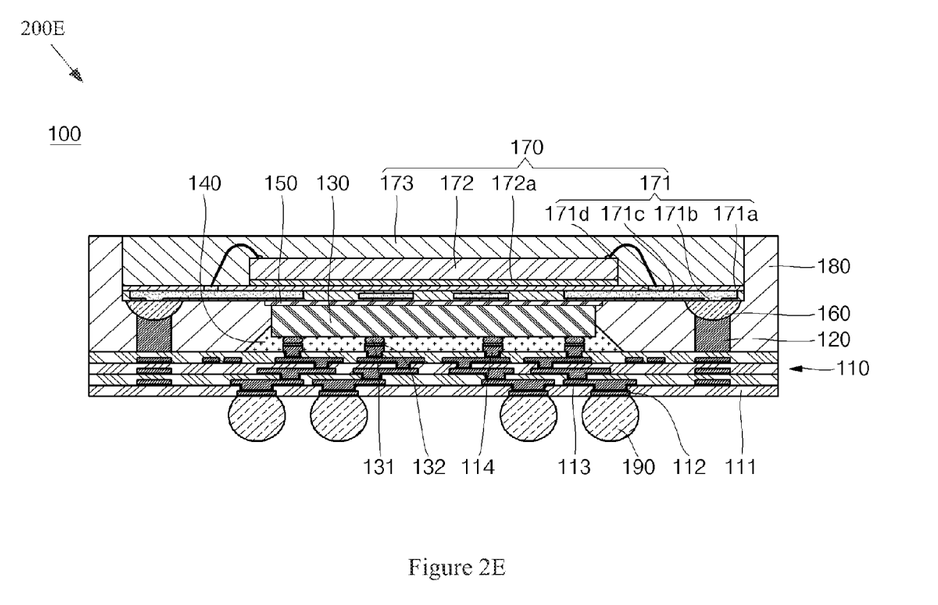

Additionally, comparing the example implementation 200D to the example implementation 200E, the carrier 10 has been removed from the substrate 110.

In general, block 1050 comprises encapsulating. Accordingly, the scope of this disclosure should not be limited by characteristics of any particular type of encapsulating material or by any particular manner of performing the encapsulating.

The example method 1000 may, at block 1060, comprise forming interconnection structures. Block 1060 may comprise forming the interconnection structures in any of a variety of manners, non-limiting examples of which are provided herein.

The interconnection structure may comprise characteristics of any of a variety of different types of interconnection structures. For example, the interconnection structures may comprise a conductive ball or bump (e.g., a solder ball or bump), a metal pillar or post (e.g. a copper pillar or post), etc. The interconnection structures may, for example, comprise metal, conductive adhesive or epoxy, etc. The interconnection structures may, for example, comprise any of a variety of metals (e.g., copper, aluminum, nickel, iron, silver, gold, titanium, chromium, tungsten, tin, lead, combinations thereof, alloys thereof, equivalents thereof, etc.), but the scope of the present disclosure is not limited thereto.

The interconnection structures may be arranged (or configured) in any of a variety of manners. For example, the interconnection structures may be arranged in a ball grid array (BGA) configuration, a land grid array (LGA) configuration (e.g., without conductive balls), etc. The interconnection structures may, for example, be arranged in a perimeter pattern outside the footprint of the semiconductor die. Also for example, the interconnection structures may be arranged in a matrix pattern in which at least some of the interconnection structures are within the footprint of the semiconductor die.

Block 1060 may comprise forming the interconnection structures in any of a variety of manners (e.g., ball dropping, pasting and reflowing, plating, printing and reflowing, printing and curing, etc.), but the scope of this disclosure is not limited thereto. For example, block 1060 may comprise forming the interconnection structures on the lands (or pads, traces, patterns, etc.) of the substrate provided at block 1010.

An example implementation 200E showing various aspects of block 1060 is shown at FIG. 2E. The example implementation 200E (or assembly, sub-assembly, package, etc.) comprises interconnection structures 190 on the lands 112 of the substrate 110. As discussed herein, such lands 112 may comprise the same material as the conductive layers of the substrate 110, such lands 112 may comprise any of a variety of under bump metallization, etc. An example electronic device resulting from the example method 1000 blocks 1010-1060 may, for example, be the electronic device 100 shown in FIG. 2E.

In general, block 1060 comprises forming interconnection structures. Accordingly, the scope of this disclosure should not be limited by characteristics of any particular type of encapsulating material or by any particular manner of performing the encapsulating.

The example method 1000 may, at block 1095, comprise continuing the manufacturing (or processing). Block 1095 may comprise continuing the manufacturing (or processing) in any of a variety of manners, non-limiting examples of which are provided herein.

For example, block 1095 may comprise performing any of a variety of additional processing steps. For example, block 1095 may comprise performing additional electronic device processing steps, for example singulating the electronic device from a wafer or panel of such devices, mounting the electronic device to a module substrate or motherboard, mounting additional electronic components, attaching additional device interconnection structures, performing additional encapsulating, covering, general packaging, testing, marking, shipping, etc. Also for example, block 1095 may comprise directing execution flow of the example method 1000 to any previous block (or portion thereof) of the example method 1000. Additionally for example, block 1095 may comprise directing execution flow of the example method 1000 to any other method step disclosed herein. Further for example, block 1095 may comprise directing execution flow of the example method 1000 to any method, or portion thereof.

In general, block 1095 may comprise continuing the manufacturing (or processing) of the electronic device. Thus, the scope of this disclosure should not be limited by characteristics of any particular manner or type of continued manufacturing (or processing).

The example method 1000 is presented herein for illustrative purposes only and not by way of limitation. For example, as mentioned herein, the order of the blocks (or portions thereof) may be changed without departing from the scope of this disclosure. Also for example, various blocks (or portions thereof) may be omitted or added without departing from the scope of this disclosure.

For example, as discussed herein with reference to block 1030 of the example method 1000, in various example implementations, the underfill between the mounted semiconductor die and the substrate need not be formed at block 1030, if ever. In such a scenario, the underfill may instead be formed as part of block 1050, for example as part of the encapsulating process.

Figure 3:
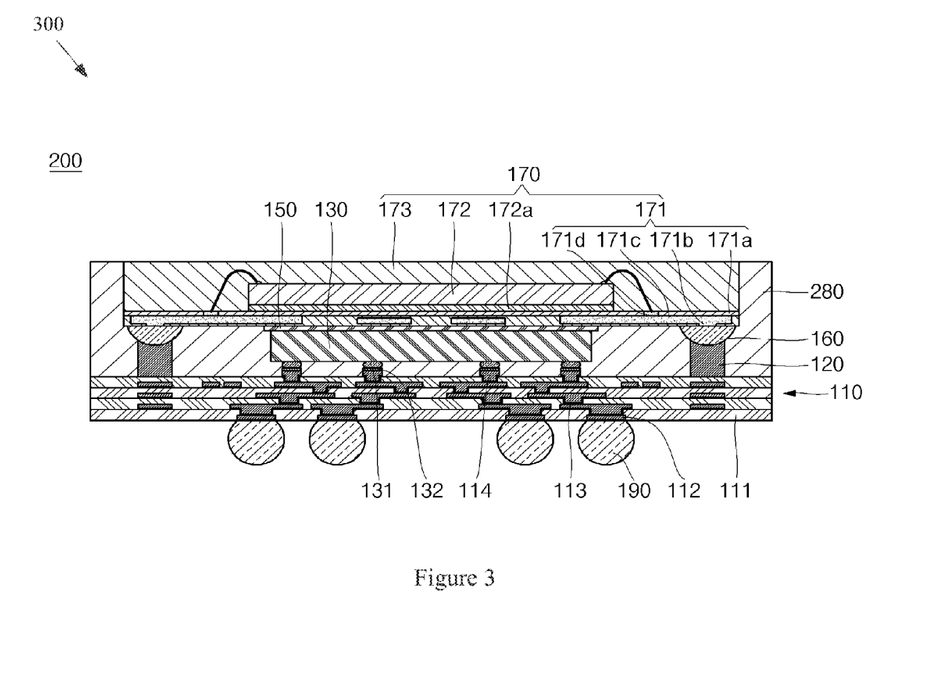
FIG. 3 shows a cross-sectional view of an example electronic device and example method of making an electronic device, in accordance with various aspects of the present disclosure.

An example implementation 300 showing various aspects of block 1060 is shown at FIG. 3. The example implementation 300 may, for example, share any or all characteristics with any of the other example implementations presented herein. For example, the example implementation 300 may share any or all characteristics with the example implementations 200A-200E of FIGS. 2A-2E.

The example implementation 300 (or assembly, subassembly, package, etc.) comprises an encapsulating material 280, which may for example share any or all characteristics with the encapsulating material 180 discussed herein. In comparison to the example implementation 200E shown in FIG. 2E, the example encapsulating material 280 of the example implementation 300 underfills between the semiconductor die 130 and the substrate 110, for example instead of the separate underfill 140 of the example implementation 200E. A portion of the encapsulating material 280 may, for example, comprise a molded underfill. Thus, an example electronic device resulting from the example method 1000 blocks 1010-1060 may, for example, be the electronic device 200 shown in FIG. 3.

The discussion herein included numerous illustrative figures that showed various portions of an electronic assembly and method of manufacturing thereof. For illustrative clarity, such figures did not show all aspects of each example assembly. Any of the example assemblies and/or methods provided herein may share any or all characteristics with any or all other assemblies and/or methods provided herein. For example and without limitation, any of the example assemblies and/or methods shown and discussed with regard to FIGS. 1 and 2, or portions thereof, may be incorporated into any of the example assemblies and/or methods discussed with regard to FIG. 3. Conversely, any of the assemblies and/or methods shown and discussed with regard to FIG. 3 may be incorporated into the assemblies and/or methods shown and discussed with regard to FIGS. 1 and 2.

In summary, various aspects of this disclosure provide an electronic device and a method of making an electronic device. As non-limiting examples, various aspects of this disclosure provide various methods of manufacturing electronic devices, and electronic devices manufactured thereby, that comprise utilizing an adhesive layer to attach an upper electronic package to a lower die and/or utilizing metal pillars for electrically connecting the upper electronic package to a lower substrate, wherein the metal pillars have a smaller height above the lower substrate than the lower die.

While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. An electronic device comprising:
   a substrate comprising a top substrate side, a bottom substrate side, and lateral substrate sides between the top and bottom substrate sides;
   a semiconductor die comprising a top die side, a bottom die side, and lateral die sides between the top and bottom die sides, wherein the bottom die side is coupled to the top substrate side;
   a first conductive interconnection structure between the semiconductor die and the substrate and electrically connecting the semiconductor die to the substrate;
   an adhesive layer comprising a top adhesive layer side, a bottom adhesive layer side, and lateral adhesive layer sides between the top and bottom adhesive layer sides, wherein the bottom adhesive layer side is adhered to the top die side;
   an upper semiconductor package comprising a top upper package side, a bottom upper package side, and lateral upper package sides between the top and bottom upper package sides, wherein the bottom upper package side is adhered to the top adhesive layer side, and wherein the upper semiconductor package comprises:
      an upper package substrate; and
      an upper package semiconductor die coupled to a top side of the upper package substrate;
   a first encapsulating material that covers at least the top substrate side, the lateral upper package sides, lateral sides of the upper package substrate, a bottom side of the upper package substrate, the lateral die sides, and the lateral adhesive sides, wherein a top surface of the first encapsulating material is higher than a top side of the upper package semiconductor die; and
   an upper package encapsulating material that covers a top side of the upper package semiconductor die.

2. The electronic device of claim 1, wherein the adhesive layer covers the entire top die side.

3. The electronic device of claim 2, wherein the first encapsulating material covers the lateral adhesive layer sides, and covers a portion of the bottom adhesive layer side.

4. The electronic device of claim 3, wherein the portion of the bottom adhesive layer side covered by the first encapsulating material comprises a peripheral ring of the bottom adhesive layer side around the top die side.

5. The electronic device of claim 1, comprising an underfill layer between the semiconductor die and the substrate, and wherein lateral sides of the underfill are covered by the first encapsulating material.

6. The electronic device of claim 5, wherein the adhesive layer is less than half as thick as the underfill layer.

7. The electronic device of claim 1, wherein the upper package encapsulating material comprises a top surface that is coplanar with the top surface of the first encapsulating material.

8. The electronic device of claim 7, wherein the top surface of the first encapsulating material and the top surface of the upper package encapsulating material are top surfaces of the electronic device.

9. The electronic device of claim 1, comprising:
a metal pillar on the top substrate side; and
a conductive bump on the metal pillar,
wherein the metal pillar and the conductive bump electrically connect the upper semiconductor package to the substrate, and
wherein the first encapsulating material directly contacts and surrounds a lateral surface of the metal pillar and a lateral surface of the conductive bump.

10. The electronic device of claim 9, wherein:
the substrate comprises an interconnect pad at the top substrate side; and
at least a portion of the metal pillar is plated on the interconnect pad.

11. The electronic device of claim 9, wherein:
a top side of the metal pillar, relative to the top substrate side, is lower than the top die side; and
the top side of the metal pillar, relative to the top substrate side, is higher than the bottom die side.

12. An electronic device comprising:
a substrate comprising a top substrate side, a bottom substrate side, and lateral substrate sides between the top and bottom substrate sides;
a semiconductor die comprising a top die side, a bottom die side, and lateral die sides between the top and bottom die sides, wherein the bottom die side is coupled to the top substrate side;
a first conductive interconnection structure between the semiconductor die and the substrate and electrically connecting the semiconductor die to the substrate;
an adhesive layer comprising a top adhesive layer side, a bottom adhesive layer side, and lateral adhesive layer sides between the top and bottom adhesive layer sides, wherein the bottom adhesive layer side is adhered to the top die side;
an upper semiconductor package comprising a top upper package side, a bottom upper package side, and lateral upper package sides between the top and bottom upper package sides, wherein the bottom upper package side is adhered to the top adhesive layer side; and
a first encapsulating material of a single continuous material that covers the top substrate side, the lateral die sides, and the lateral adhesive layer sides,
wherein the first encapsulating material covers a portion of the bottom adhesive layer side,
and wherein the first encapsulating material comprises a first surface that is coplanar with the top adhesive layer side and at a vertical height above the substrate that is lower than an uppermost surface of the first encapsulating material.

13. The electronic device of claim 12, wherein the adhesive layer is the only layer of material between the top die side and the bottom upper package side.

14. The electronic device of claim 12, wherein the portion of the bottom adhesive layer side covered by the first encapsulating material comprises a peripheral ring of the bottom adhesive layer side around the top die side.

15. The electronic device of claim 12, wherein the uppermost surface of the first encapsulating material is at least as high as the top upper package side.

16. The electronic device of claim 12, comprising:
an upper package conductive bump extending downward from the bottom upper package side; and
a conductive pillar on the top substrate side and that is directly connected to the upper package conductive bump, wherein the conductive pillar comprises a column-shaped continuous metal layer that comprises:
a top column side that is no higher than the top adhesive layer side;
a bottom column side that is at least as low, relative to the top substrate side, as the bottom die side; and
a lateral column side that extends vertically between the top column side and the bottom column side.

* * * * *